(12) United States Patent
Bauer et al.

(10) Patent No.: US 7,939,447 B2
(45) Date of Patent: May 10, 2011

(54) INHIBITORS FOR SELECTIVE DEPOSITION OF SILICON CONTAINING FILMS

(75) Inventors: Matthias Bauer, Phoenix, AZ (US); Pierre Tomasini, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 258 days.

(21) Appl. No.: 11/925,518

(22) Filed: Oct. 26, 2007

(65) Prior Publication Data
US 2009/0111246 A1 Apr. 30, 2009

(51) Int. Cl.
*H01L 21/31* (2006.01)
(52) U.S. Cl. ........... 438/680; 216/58; 216/37; 216/79
(58) Field of Classification Search .......... 257/369, 257/19, 192, 254; 438/622, 150, 478, 481
See application file for complete search history.

(56) References Cited

U.S. PATENT DOCUMENTS

| | | | |
|---|---|---|---|
| 2,761,853 A * | 9/1956 | Uraneck et al. | 524/836 |
| 2,860,173 A * | 11/1958 | Jones et al. | 585/449 |
| 3,377,395 A * | 4/1968 | Christoph, Jr. | 570/154 |
| 4,058,430 A | 11/1977 | Suntola et al. | |
| 4,161,462 A * | 7/1979 | Bocharov et al. | 502/109 |
| 4,413,022 A | 11/1983 | Suntola et al. | |
| 4,656,021 A | 4/1987 | Tanabe et al. | |
| 4,747,367 A | 5/1988 | Posa | |
| 4,761,269 A | 8/1988 | Conger et al. | |
| 5,071,670 A | 12/1991 | Kelly | |
| 5,112,439 A | 5/1992 | Reisman et al. | |
| 5,194,398 A | 3/1993 | Miyachi et al. | |
| 5,221,556 A | 6/1993 | Hawkins et al. | |
| 5,306,666 A | 4/1994 | Izumi | |
| 5,674,781 A | 10/1997 | Huang et al. | |
| 5,711,811 A | 1/1998 | Suntola et al. | |
| 5,769,950 A | 6/1998 | Takasu et al. | |
| 5,831,335 A | 11/1998 | Miyamoto | |
| 5,851,589 A | 12/1998 | Nakayama et al. | |
| 5,879,459 A | 3/1999 | Gadgil et al. | |
| 5,904,565 A | 5/1999 | Nguyen et al. | |
| 5,916,365 A | 6/1999 | Sherman | |
| 5,933,761 A | 8/1999 | Lee | |
| 6,013,155 A | 1/2000 | McMillin et al. | |
| 6,015,590 A | 1/2000 | Suntola et al. | |

(Continued)

FOREIGN PATENT DOCUMENTS

DE 19820147 7/1999

(Continued)

OTHER PUBLICATIONS

Abeles et al.; *Amorphous Semiconductor Superlattices*; Physical Review Letters; Nov. 21, 1983; pp. 2003-2006; vol. 51; No. 21.

(Continued)

*Primary Examiner* — Thanh V Pham
*Assistant Examiner* — Mark A Laurenzi, III
(74) *Attorney, Agent, or Firm* — Knobbe Martens Olson & Bear LLP

(57) ABSTRACT

A method for depositing a single crystalline silicon film comprises: providing a substrate disposed within a chamber; introducing to the chamber under chemical vapor deposition conditions a silicon precursor, a chlorine-containing etchant and an inhibitor source for decelerating reactions between the silicon precursor and the chlorine-containing etchant; and selectively depositing a doped crystalline Si-containing film onto the substrate.

25 Claims, 3 Drawing Sheets

U.S. PATENT DOCUMENTS

| | | | |
|---|---|---|---|
| 6,037,258 A | 3/2000 | Liu et al. |
| 6,042,654 A | 3/2000 | Comita et al. |
| 6,048,790 A | 4/2000 | Lacoponi et al. |
| 6,069,068 A | 5/2000 | Rathore et al. |
| 6,077,775 A | 6/2000 | Stumborg et al. |
| 6,083,818 A | 7/2000 | Stumborg et al. |
| 6,093,252 A | 7/2000 | Wengert et al. |
| 6,093,368 A | 7/2000 | Chu et al. |
| 6,100,184 A | 8/2000 | Zhao et al. |
| 6,139,700 A | 10/2000 | Kang et al. |
| 6,146,517 A | 11/2000 | Hoinkis |
| 6,148,761 A | 11/2000 | Majewski et al. |
| 6,181,012 B1 | 1/2001 | Edelstein et al. |
| 6,184,128 B1 | 2/2001 | Wang et al. |
| 6,188,134 B1 | 2/2001 | Stumborg et al. |
| 6,200,893 B1 | 3/2001 | Sneh |
| 6,203,613 B1 | 3/2001 | Gates et al. |
| 6,207,487 B1 | 3/2001 | Kim et al. |
| 6,207,567 B1 | 3/2001 | Wang et al. |
| 6,225,213 B1 | 5/2001 | Urabe |
| 6,270,572 B1 | 8/2001 | Kim et al. |
| 6,287,965 B1 | 9/2001 | Kang et al. |
| 6,291,876 B1 | 9/2001 | Stumborg et al. |
| 6,303,523 B2 | 10/2001 | Cheung et al. |
| 6,340,619 B1 | 1/2002 | Ko |
| 6,342,448 B1 | 1/2002 | Lin et al. |
| 6,351,039 B1 | 2/2002 | Jin et al. |
| 6,358,829 B2 | 3/2002 | Yoon et al. |
| 6,368,954 B1 | 4/2002 | Lopatin et al. |
| 6,380,065 B1 | 4/2002 | Komai et al. |
| 6,391,785 B1 | 5/2002 | Satta et al. |
| 6,399,491 B2 | 6/2002 | Jeon et al. |
| 6,444,495 B1 | 9/2002 | Leung et al. |
| 6,482,733 B2 | 11/2002 | Raaijmakers et al. |
| 6,511,539 B1 | 1/2003 | Raaijmakers |
| 6,521,048 B2 | 2/2003 | Miller et al. |
| 6,555,839 B2 | 4/2003 | Fitzgerald |
| 6,562,140 B1 | 5/2003 | Bondestam et al. |
| 6,583,015 B2 | 6/2003 | Fitzgerald et al. |
| 6,583,048 B1 | 6/2003 | Vincent et al. |
| 6,593,191 B2 | 7/2003 | Fitzgerald |
| 6,716,713 B2 | 4/2004 | Todd |
| 6,727,169 B1 | 4/2004 | Raaijmakers et al. |
| 6,820,570 B2 | 11/2004 | Kilpela et al. |
| 6,821,825 B2 | 11/2004 | Todd et al. |
| 6,900,115 B2 | 5/2005 | Todd |
| 6,958,253 B2 | 10/2005 | Todd |
| 6,962,859 B2 | 11/2005 | Todd et al. |
| 6,969,875 B2 | 11/2005 | Fitzgerald |
| 7,020,981 B2 | 4/2006 | Shero et al. |
| 7,026,219 B2 | 4/2006 | Pomarede et al. |
| 7,030,042 B2 | 4/2006 | Vaartstra |
| 7,091,522 B2 | 8/2006 | Lee et al. |
| 7,132,338 B2 | 11/2006 | Samoilov et al. |
| 7,166,528 B2 | 1/2007 | Kim et al. |
| 7,186,630 B2 | 3/2007 | Todd |
| 7,195,985 B2 | 3/2007 | Murthy et al. |
| 7,208,362 B2 | 4/2007 | Chidambaram |
| 7,235,492 B2 | 6/2007 | Samoilov |
| 7,237,460 B2 | 7/2007 | Hu |
| 7,273,526 B2 | 9/2007 | Shinriki et al. |
| 7,282,239 B2 | 10/2007 | Sarigiannis et al. |
| 7,307,273 B2 | 12/2007 | Currie |
| 7,335,545 B2 | 2/2008 | Currie |
| 7,396,415 B2 | 7/2008 | Arena et al. |
| 7,413,627 B2 | 8/2008 | Li et al. |
| 7,438,760 B2 | 10/2008 | Bauer et al. |
| 7,537,662 B2 | 5/2009 | Soininen et al. |
| 7,560,352 B2 | 7/2009 | Carlson et al. |
| 2001/0001742 A1 | 5/2001 | Huang et al. |
| 2001/0034123 A1 | 10/2001 | Jeon et al. |
| 2002/0023520 A1 | 2/2002 | Hu |
| 2002/0168868 A1 | 11/2002 | Todd |
| 2004/0043636 A1* | 3/2004 | Vaartstra et al. ............ 438/785 |
| 2004/0142558 A1 | 7/2004 | Granneman |
| 2004/0216668 A1 | 11/2004 | Lindfors et al. |
| 2004/0224089 A1 | 11/2004 | Singh et al. |
| 2004/0262694 A1 | 12/2004 | Chidambaram |
| 2005/0079692 A1 | 4/2005 | Samoilov et al. |
| 2005/0092247 A1 | 5/2005 | Schmidt et al. |
| 2005/0250298 A1 | 11/2005 | Bauer |
| 2006/0011984 A1 | 1/2006 | Currie |
| 2006/0014366 A1 | 1/2006 | Currie |
| 2006/0115933 A1 | 6/2006 | Ye et al. |
| 2006/0166414 A1 | 7/2006 | Carlson et al. |
| 2006/0169668 A1* | 8/2006 | Samoilov ..................... 216/58 |
| 2006/0169669 A1 | 8/2006 | Zojaji et al. |
| 2006/0205194 A1 | 9/2006 | Bauer |
| 2006/0216417 A1 | 9/2006 | Todd et al. |
| 2006/0234504 A1 | 10/2006 | Bauer et al. |
| 2006/0266289 A1 | 11/2006 | Verghese et al. |
| 2006/0289900 A1 | 12/2006 | Thirupapuliyur et al. |
| 2007/0015374 A1 | 1/2007 | Granneman |
| 2007/0259112 A1 | 11/2007 | Ishikawa et al. |
| 2008/0202416 A1 | 8/2008 | Provencher et al. |
| 2009/0111246 A1 | 4/2009 | Bauer et al. |

FOREIGN PATENT DOCUMENTS

| | | |
|---|---|---|
| DE | 10026180 | 12/2001 |
| EP | 1024210 | 8/2000 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 | 12/2000 |
| WO | WO 00/79576 | 12/2000 |
| WO | WO 01/15220 | 3/2001 |
| WO | WO 01/36702 | 5/2001 |
| WO | WO 01/45149 | 6/2001 |
| WO | WO 01/66832 | 9/2001 |
| WO | WO 01/78123 | 10/2001 |
| WO | WO 01/78124 | 10/2001 |
| WO | WO 01/99166 | 12/2001 |
| WO | WO 2004/025716 | 3/2004 |

OTHER PUBLICATIONS

Antonell et al., "Carbon incorporation for strain compensation during solid phase epitaxial recrystallization of SiGe on Si at 500-600° C", J. Appl. Phys. 79 (10), pp. 7646-7651 (1996).

Aoyama, T., "Si Selective Epitaxial Growth Using C12 Pulsed Molecular Flow Method," Thin Solid Films 321 (1998) 256-260, © 1998 Elsevier Science S.A.

Bauer et al., "$Si_3H_8$ based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy*; Semicond Sci. Technol; 1993; 1052-1062; vol. 8.

Düscö et al.; *Deposition of Tin Oxide into Porous Silicon by Atomic Layer Epitaxy*; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; *A High-C Capacitor (20.4 Ff/µm2) with Ultrathin CVD—Ta2O5 Films Deposited on Rugged Poly-Si for High Density DRAMs*; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Horiike et al.; *Filling of Si Oxide into a Deep Trench using Digital CVD Method*; Applied Surface Science; 1990; pp. 168-174; vol. 46.

Hoyt, "Substitutional carbon incorporation and electronic characterization of $Si_{1-y}C_y/Si$ and $Si_{1-x-y}Ge_xC_y/Si$ heterojunctions", Chapter 3 in "Silicon-Germanium Carbon Alloy", Taylor and Francis (New York, NY), pp. 59-89 (2002).

Jin et al.; *Porous Silica Xerogel Processing and Integration for ULSI Applications*; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; *Deposition of copper films by an alternate supply of CuCl and Zn*; J. Vac. Sci. Technol.; 1997; pp. 2003; vol. issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kikkawa et al.; *A Quarter-Micrometer Interconnection Technology Using a TiN/Al-Si-Cu/TiN/Al-Si-Cu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.; *Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of Ti AlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-C5-951; vol. 5.

MacKnight et al., "RTP applications and technology options for the sub-45 nm node", Proceedings, RTP2004 Conference (Portland, OR) (2004).

Martensson et al.; *Atomic layer epitaxy of copper an ab initio investigation of the CuCl/H2 process III. Reaction barriers*; Appl. Surf. Sci.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.

Martensson et al.; *CU(THD)2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.

Min et al.; *Chemical Vapor Deposition of Ti-Si-N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films*; Applied Physics Letters; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Moller; *Copper and Nickel Ultrathin Films on Metal-Oxide Crystal Surfaces* Mater. Soc. Monogr.; 1994; 473-522; 81.

Niinistö et al.; *Synthesis of oxide thin films and overlayers by atomic layer epitaxy for advanced applications*; Materials Science and Engineering; 1996; pp. 23-29; vol. B41.

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

O'Neil et al., "Optimization of process conditions for selective silicon epitaxy using disilane, hydrogen, and chlorine", J. Electrochem. Soc. 144 (9), pp. 3309-3315 (1997).

Osten et al., "Substitutional carbon incorporation in epitaxial $Si_{1-y}C_y$ alloys on Si(001) grown by molecular beam epitaxy", Applied Physics Letters 74 (6), pp. 836-838 (1999).

Osten et al., "Substitutional versus interstitial carbon incorporation during psuedomorphic growth of $Si_{1-y}C_y$ on Si(001)", J. Appl. Phys. 80 (12), pp. 6711-6715 (1996).

Ott et al.; *Modification of Porous Alumina membranes Using Al2O3 Atomic Layer Controlled Deposition*; Chem. Mater.; 1997; pp. 707-714; vol. 9.

PCT Search Report, PCT Application PCT/US2006/003333; filed Jan. 31, 2006.

PCT Search Report, PCT Application PCT/US2006/003465; filed Jan. 31, 2006.

PCT Search Report, PCT Application PCT/US2008/080803, filed Oct. 22, 2008.

Ritala et al.; *Atomic Layer Epitaxy Growth of TiN Thin Films from TiI4 and NH3*; J. Electrochem. Soc.; Aug. 1998; pp. 2914-2920; vol. 145; No. 8.

Ritala et al.; *Controlled Growth of TaN, Ta3N5, and TaOxNy Thin Filims by Atomic Layer Deposition*; Chem. Mater.; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition*; Chem Vap. Deposition; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999, pp. IITC 99-187-IITC 99-189.

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

Singer; *Atomic Layer Deposition Targets Thin Films*; Semiconductor International; Sep. 1999; pp. 40.

Sneh et al.; *Atomic layer growth of SiO2 on Si(100) using SiCl4 and H2O in a binary reaction sequence*; Surface Science; 1995; pp. 135-152; vol. 334.

Solanki et al.; *Atomic Layer Deposition of Copper Seed Layers*; Electrochem. and Solid State Lett.; 2000; 479-480; 3(10).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained $Si_{1-y}C_y/Si$ heterostructures", J. Appl. Phys. 76 (6), pp. 3656-3668 (1994).

Tiitta et al.; *Preparation and Characterization of Phosphorus-Doped Aluminum Oxide Thin Films*; Materials Research Bulletin; 1998; pp. 1315-1323; vol. 33, No. 9.

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang; *Spin on Dielectric Films—A General Overview*; 1998 5th International Conference on Solid-State and Integrated Circuit Technology Proceedings; Oct. 21-23, 1998; p. 961; Beijing, China.

Windl et al., "Theory of strain and electronic structure of $Si_{1-y}C_y$ and $Si_{1-x-y}Ge_xC_y$ alloys", Phys. Rev. B57 (4), pp. 2431-2442 (1998).

Wise et al.; *Diethyldiethoxysilane as a New Precursor for SiO2 Growth on Silicon*; Mat. Res. Soc. Symp. Proc.; 1994; pp. 37-43; vol. 334.

Wolf et al.; *Process and Equipment Simulation of Copper Chemical Vapor Deposition Using Cu(hfac)vtms*; Microelectronic Engineering; 1999; 15-27; 45.

Yagi et al.; *Substitutional C incorporation into Si1—yCy alloys using novel carbon source, 1,3-disilabutane*; Japanese Journal of Applied Physics; 2004; pp. 4153-4154; vol. 43, No. 7A.

Rubtsov, N. et al., "Dicholorosilane chrlorination in the presence of propylene as an inhibitor at low pressures and 293 K," Mendeleev Communications, Electronic Version, 2002, Issue 1, pp. 1-3.

Ho, P. et al., "A Theoretical study of the heats of formation of $SiH_n$, $SiCl_n$, and $SiH_nCl_m$ compounds," J. Phys. Chem., 1985, vol. 89, pp. 4647-4654.

Niki, H. et al., "An FTIR study of the kinetics and mechanism for the Cl- and Br-Atom-Initiated oxidation of $SiH_4$," J. Phys. Chem., 1985, vol. 89, pp. 1752-1755.

Bell, T. et al., "Calculation of heats of formation and dissociation of methyl- and chloro-subsituted disilanes," J. Phys. Chem., 1982, vol. 86, pp. 3922-3925.

Walsh, R., "Bond dissociation energy values in silicon-containing compounds and some of their implications," Acc. Chem. Res., 1981, vol. 14, pp. 246-252.

Regolini, J. et al., "Selective epitaxial silicon growth in the 650-1100°C range in a reduced pressure chemical vapor deposition reactor using dichlorosilane," Appl. Phys. Lett., 1989, vol. 54, pp. 658-659.

Schlyer, D. and Gaspar, P., "Rate constants for the reactions of atomic chlorine with group 4 and group 5 hydrites," J. Phys. Chem., 1978, vol. 82, pp. 2633-2637.

Neudorfl, P. and Strausz, O., "Pryolysis of monomethyl- and dimethylsilane. The role of molecular and radical processes," J. Phys. Chem., 1978, vol. 82, pp. 241-242.

Feher, F. et al., "Contributions to the chemistry of silicon and germanium. The transformation of disilane, trisilane, and n-Tetrasilane with elementary bromine and chlorine in Freon," Inorganic Chemistry, 1971, vol. 10, pp. 606-608.

Hollandsworth, R. and Ring, M., "Choridisilanes. Preparation and silicon-hydrogen stretching frequencies," Chloridisanes, 1968, vol. 7, No. 8, pp. 1635-1637.

Knutson, K. et al., "A kinetics and transport model of dichlorosilane chemical vapor deposition," J. Crystal Growth, 1994, vol. 140, pp. 191-204.

Baklanov, A. and Chichinin, A., "Time-resolved LMR measurement of the rate constants of the reactions $SiH_3+SiH_3$ and $SiH_3+Cl$," Chemical Physics, 1994, vol. 181, pp. 119-128.

Chesnokov, E. and Panfilov, V.; Dokl. Akad. SSSR, 1981, 261, 925 [Dokl. Chem. (Engl. Transl.), 1981, 261, 865].

Begishev, I. et al., Zh. Fiz. Khim., 1994, 68, 1099 (Russ. J. Phys. Chem., 1994, 69, 992).

Swihart, M. and Carr, R., J. Phys. Chem., A,. 1998, 102, 1542.

Sararik, I. et al., Research Chem. Intermed., 1990, 14, 108.

Parijskaya, A. and Vedeneev, V., Kinet. Katal., 1973, 14, 1116 [Kinet. Catal. (Engl. Transl.), 1973, 14, 981].

Rubtsov, N. et al, Izv. Akad. Nauk SSSR, Ser. Him., 1980, 1234 (Bull. Acad. Sci. USSR, Div. Chem. Sci., 1980, 29, 1165).

Azatyan, V., Kinet. Katal., 1975, 16, 567 [Kinet. Catal. (Engl. Transl.), 1975, 16, 487].

Conner, C. and Stewart, E., J. Am. Chem. Soc., 1977, 99, 2544.

Chau, F. et al., J. Phys. Chem., A., 1999, 103, 4925.

Aivazyan, R. and Azatyan, V, Khim. Fiz., 1997, 16, 621 [Chem. Phsy. Reports (Engl. Transl.), 1997, 16, 599].

Chasovnikov, S. and Krasnoperov, L., Direct determination of branching probability per chain unit in the reaction of $SiH_4$ with $Cl_2$ by pulsed photolysis time-resolved laser magnetic resonance, Chem. Phys. Lett., Feb. 1986, pp. 248-255, vol. 124, No. 3.

Chasovnikov, S. et al., Pressure quenching of chain branching reactions of $SiH_4$ and $SiD_4$ chlorination, Chem. Phys., 1990, pp. 339-346, vol. 143.

Krasnoperov, E. et al., The Time-resolved LMR method as used to measure elementary reaction rates of Cl atoms and $SiH_3$ radicals in pulse photolysis of $S_2Cl_2$ in the presence of $SiH_4$, Chem. Phys., 1984, pp. 297-305, vol. 89.

Shudo, K. et al., Quantitative analysis of thermally induced desorption during halogen-etching of a silicon (111) surface, Surface Science, 2006.

Swihart, M. and Carr, R., Thermochemistry and thermal decomposition of the chlorinated disilanes ($Si_2H_nCl_{6-n}$, n=0-6) studied by ab initio molecular orbital methods, J. Phys. Chem., 1997, pp. 7434-7445, vol. 101.

Swihart, M. and Carr, R., Thermal decomposition of dichlorosilane investigated by pulsed laser powered homogeneous pyrolysis, J. Electrochem. Soc., Dec. 1997, pp. 4357-4361, vol. 144, No. 12.

Violette, K. et al., Low temperature selective silicon epitaxy by ultra high vacuum rapid thermal chemical vapor deposition using Si2H6, H2 and Cl2, Appl. Phys. Lett., Jan. 1996, pp. 66-68, vol. 68, No. 1.

Ding, L. and Marshall, P., Kinetic studies of the reactions of atomic chlorine and bromine with silane, J. Phys. Chem., 1992, pp. 2197-2201, vol. 96.

Knizikevicius, R., Silicon etching in Cl2 environment, App. Surface Sci., 2006, pp. 1581-1583, vol. 253.

Bauer, M. and Thomas, S., Novel CVD strategies and novel chemical precursors enabling low temperature epitaxy of Si and Si:C alloys, 2009.

Rubtsov, N. et al., Kinet. Katal., 1997, 38, 495, [Kinet. Catal. (Engl. Transl.), 1997, vol. 38, pp. 457-463].

Azatyan, V. et al., Khim. Fiz., 1983, vol. 26, Part 2, pp. 191-194.

Semenov, N., O nekotorykh problemmakh khimichesko kinetiki I reakisionnoi sposobnosti (On Some Problems of Chemical Kinetics and Reactivity), Akad. Nauk SSSR, Moscow, 1958, pp. 19-46.

Denisov, E. and Azatyan V, Ingibirovanie tsepnykh reaktsii (Inhibition of Chain Reactions), Ross. Akad. Nauk, Chemogolovka, 1997, pp. 265-297.

\* cited by examiner

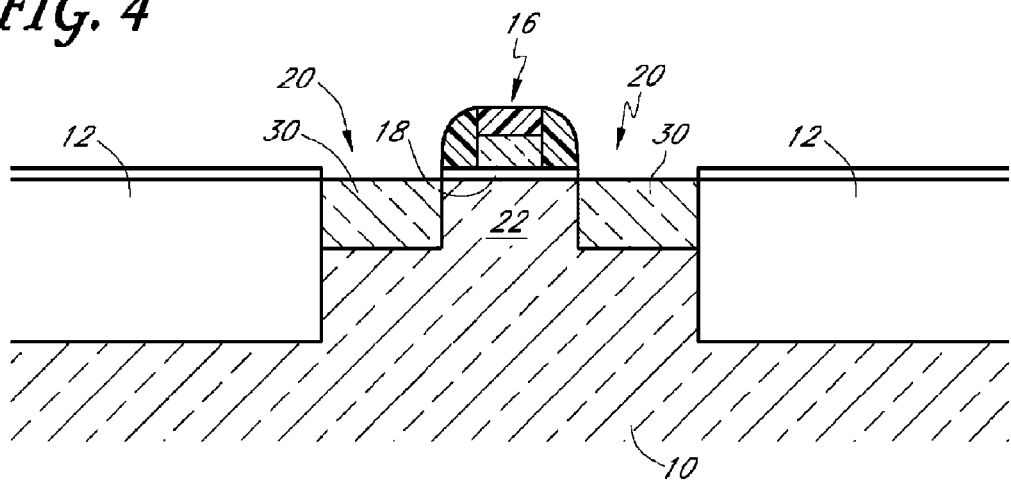
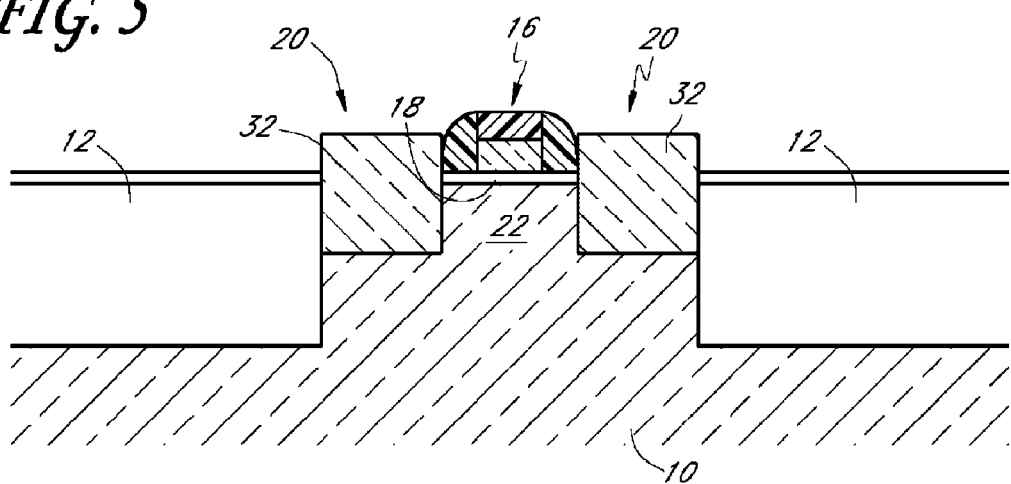
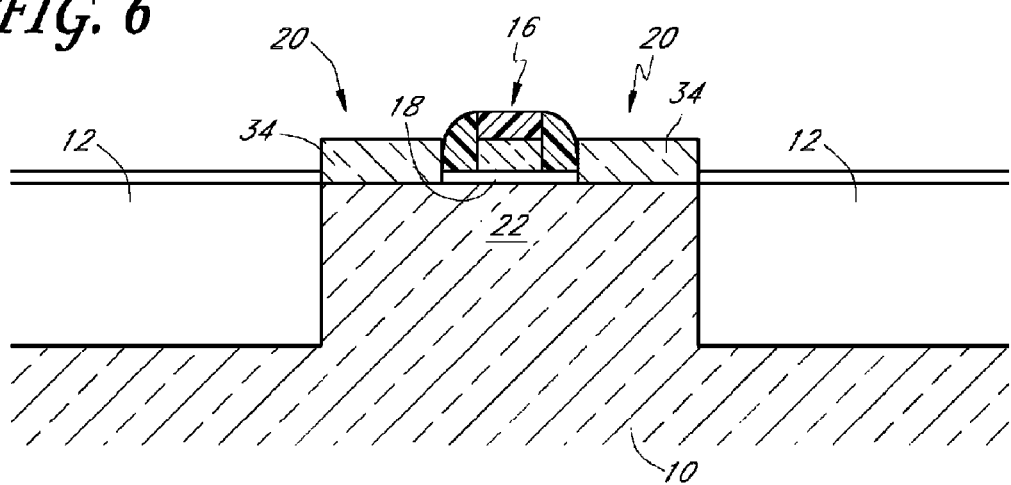

INHIBITORS FOR SELECTIVE DEPOSITION OF SILICON CONTAINING FILMS

BACKGROUND OF THE INVENTION

1. Field of the Invention

This application relates generally to the deposition of silicon-containing materials in semiconductor processing. More particularly, this application relates to the selective deposition of silicon-containing films.

2. Description of the Related Art

It is often desirable to selectively deposit silicon on semiconductor surfaces without depositing on insulating surfaces. For example, heterojunction bipolar transistors are often fabricated using selective deposition techniques that deposit epitaxially-deposited single-crystal, e.g., semiconductor films only on active areas. Other transistor designs benefit from elevated source/drain structures, which provide additional silicon that can be consumed by the source/drain contact process without altering shallow junction device performance. Selective epitaxy on source/drain regions advantageously reduces the need for subsequent patterning and etch steps. Generally speaking, selective deposition takes advantage of differential nucleation during deposition on disparate materials. The precursor of choice will generally have a tendency to nucleate and grow more rapidly on one surface and less rapidly on another surface. At the beginning of a nucleation stage, discontinuous films on oxide have a high exposed surface area relative to merged, continuous films on silicon. Accordingly, an etchant added to the process will have a greater effect upon the poorly nucleating film on the oxide as compared to the rapidly nucleating film on the silicon. The relative selectivity of a process can thus be tuned by adjusting factors that affect the deposition rate, such as precursor flow rates, temperature, pressure and the rate of etching, such as etchant flow rate, temperature, pressure. Changes in each variable will generally have different effects upon etch rate and deposition rate. Typically, a selective deposition process is tuned to produce the highest deposition rate feasible on the window of interest while accomplishing no deposition in the field regions.

Selective deposition of semiconductors is of considerable commercial importance for a variety of industrial applications. Thus, there is a need for improved methods to selectively deposit silicon onto semiconductor surfaces.

SUMMARY OF THE INVENTION

An embodiment provides a method for depositing a single crystalline silicon film. The method includes providing a substrate disposed within a chamber. A silicon precursor is introduced to the chamber under chemical vapor deposition conditions. A chlorine-containing etchant is introduced to the chamber. An inhibitor source is introduced for decelerating reactions between the silicon precursor and the chlorine-containing etchant. A crystalline Si-containing film is selectively deposited onto the substrate.

Another embodiment provides a method of depositing a crystalline Si-containing film. The method includes providing a substrate disposed within a chamber. A silicon precursor and a chlorine gas are intermixed in the chamber. Exothermic reactions between the silicon precursor and the chlorine gas are decelerated by intermixing a carbon-containing inhibitor source in the chamber. A single crystalline Si-containing film is selectively deposited onto the substrate.

Another embodiment provides an apparatus for depositing semiconductor films. The apparatus includes a silicon vapor source, a chlorine-containing etchant gas source and a carrier gas source. The apparatus also includes an inhibitor vapor source selected from the group consisting of propylene, butadiene, benzene, napthalene, phenanthrene, anthracene, cycloheptatriene cation, cycloheptatriene, furan, pyridine, pyrrole and thiophene. The apparatus also includes a gas distribution network connecting the silicon vapor, chlorine-containing etchant gas, carrier gas and inhibitor vapor sources to a chemical vapor deposition chamber. The apparatus also includes a control system configured to deliver silicon vapor, chlorine-containing etchant gas, carrier gas and inhibitor vapor to the gas distribution network under conditions suited to selectively deposit a silicon-containing layer on portions of a substrate within the chamber without depositing on other portions of the substrate.

These and other embodiments are described in greater detail below.

BRIEF DESCRIPTION OF THE DRAWINGS

FIG. 4 shows the structure of FIG. 3 after selective deposition of a semiconductor film within the recessed regions, in accordance with a preferred embodiment.

FIG. 5 shows the structure of FIG. 4 after optional continued selective deposition, forming elevated source/drain structures.

FIG. 6 shows the structure of FIG. 2 after exposing the semiconductor window and conducting a selective deposition to form elevated source/drain structures, in accordance with another preferred embodiment.

DETAILED DESCRIPTION OF THE PREFERRED EMBODIMENT

Figure 1:
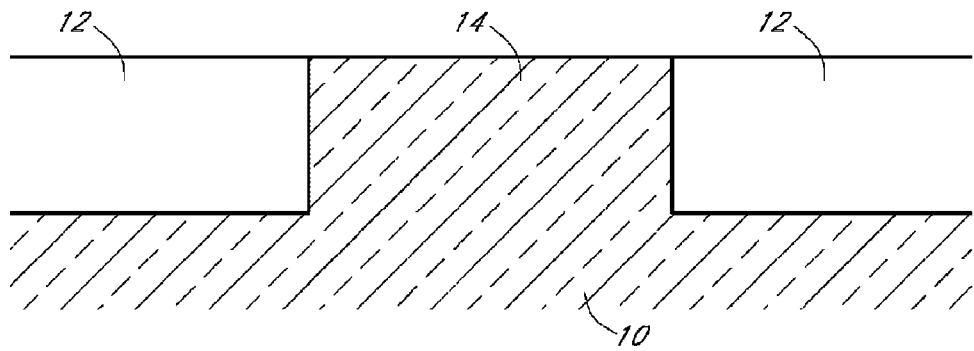
FIG. 1 is a schematic cross section of a semiconductor substrate after field oxide definition, leaving insulator and semiconductor surfaces exposed.

The term "Si-containing material" and similar terms are used herein to refer to a broad variety of silicon-containing materials including without limitation Si, Si:C, SiGe, SiGe:C, Si:Sn, (Ge:Sn, Sn:C), SiGe:Sn, SiSn:C and SiGe:Sn:C. As used herein, "carbon-doped Si," "Si:C," "SiGe," "carbon-doped SiGe," "SiGe:C" and similar terms refer to materials that contain the indicated chemical elements in various proportions and, optionally, minor amounts of other elements. For example, "SiGe" is a material that comprises silicon, germanium tin and carbon, and optionally, other elements, such as Group III (B, Ga) and V (P, As, Sb) dopants. Thus, carbon-doped Si may be referred to herein as Si:C or vice versa. Terms such as "Si:C," "SiGe," and "SiGe:C" are not stoichiometric chemical formulas per se and thus are not limited to materials that contain particular ratios of the indicated elements. The percentage of a dopant such as carbon, germanium, phosphorous, arsenic or boron in a Si-containing film is expressed herein in atomic percent on a whole film basis, unless otherwise stated.

The amount of germanium, tin and/or carbon substitutionally incorporated into a Si-containing material may be determined by measuring the perpendicular lattice spacing of the doped Si-containing material by x-ray diffraction, then applying interpolation between single crystal Si and diamond (single crystal carbon), in a manner known to those skilled in the art [Salvador Kelieres, Bertil]. Those skilled in the art are aware of the relationships between substitutional doping levels, lattice spacing and strain. See, e.g., Judy L. Hoyt, "Substitutional Carbon Incorporation and Electronic Characterization of Si1-yCy/Si and Si1-x-yGexCy/Si Heterojunctions," Chapter 3 in "Silicon-Germanium Carbon Alloy," Taylor and Francis, NY, pp. 59-89, 2002. Amounts of electrically active, substitutionally incorporated dopants such as P, As, and B may be determined by electrical resistivity measurements, e.g., four point probe measurements as known to those skilled in the art.

"Substrate," as that term is used herein, refers either to the workpiece upon which deposition is desired, or the surface exposed to the deposition gas(es). For example, the substrate may be a single crystal silicon wafer, or may be a semiconductor-on-insulator ("SOI") substrate, or may be an epitaxial Si, SiGe, Ge, GeSn or III-V material deposited upon such wafers. Workpieces are not limited to wafers, but also include glass, plastic, or any other substrate employed in semiconductor processing. A mixed or patterned substrate is a substrate that has two or more different types of surfaces. For example, a mixed substrate may comprise a first surface having a first surface morphology and a second surface having a second surface morphology. In certain embodiments, doped Si-containing layers are selectively formed over single crystal semiconductor materials while minimizing and more preferably avoiding deposition over adjacent dielectrics. Examples of dielectric materials include silicon dioxide, silicon nitride, metal oxide and metal silicate. The terms "epitaxial," "epitaxially," "heteroepitaxial," "heteroepitaxially" and similar terms are used herein to refer to the deposition of a crystalline Si-containing material onto a crystalline substrate in such a way that the deposited layer adopts or follows the lattice constant of the substrate. Epitaxial deposition is homoepitaxial when the composition of the deposited layer is the same as that of the surface on which it is deposited. Epitaxial deposition is heteroepitaxial when the composition of the deposited layer is different from that of the surface on which it is deposited.

Even if the materials are made from the same element, the surfaces can be different if the morphologies or crystallinity of the surfaces are different. The processes described herein are useful for depositing Si-containing films on a variety of substrates, but are particularly useful for mixed substrates having mixed surface morphologies. Such a mixed substrate comprises a first surface having a first surface morphology and a second surface having a second surface morphology. In this context, surface morphology refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order on an atomic scale. Epitaxial films are characterized by a crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. As used herein, single-crystal is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal, despite low density faults. Specific examples of mixed substrates include without limitation single crystal/polycrystalline, single crystal/amorphous, single crystal/dielectric, conductor/dielectric, and semiconductor/dielectric.

Selective Deposition of Silicon With an Etchant and an Inhibitor

The selective growth of intrinsic silicon-containing epitaxial layers at low temperatures raises challenges. As an example, in order to incorporate high levels of substitutional carbon into the silicon lattice, a low temperature, e.g., ideally about 500°-600° C., and high growth rate, e.g., at least about 5 nm/min, preferably at least about 10 nm/min, are desirable. However, selective growth of intrinsic silicon typically occurs at high temperatures, such as about 800°-850° C. Moreover, conventional precursors used for the selective epitaxial growth of silicon, such as dichlorosilane or silane, typically give very low growth rates at lower temperatures, with the growth rate dropping by a factor of about 2 every 200°C. On the other hand, precursors that decompose much more easily at low temperatures, including silicon hydrides such as $SiH_4$, $Si_2H_6$, or $Si_3H_8$, tend to form silicon nuclei on the insulator, which also leads to non-selective growth.

In order to achieve or maintain selectivity, a silicon etchant is typically added to the deposition reactants. When HCl is used as an etchant to enhance selectivity, the surface can become Cl-terminated at temperatures of about 750° C. or below. The Cl-terminated surface can lead to low growth rate due to the saturation of reactive sites. Accordingly, it is desirable to employ etchants more reactive than HCl for low temperature deposition such as at temperatures suited for high substitutional incorporation of carbon, e.g., below about 650° C. In one embodiment, $Cl_2$ can be more effective as an etching source because of its high etch efficiency in dissolving and etching silicon nuclei. In other embodiments, however, other low temperature and aggressive etchants, and particularly chlorine-based etchants such as $Cl_2$, may be used.

However, various exothermic reactions can occur when aggressive etchants like $Cl_2$ are used as etchants. For example, when $H_2$ is used as a carrier gas or generated as a byproduct of other reactions, an exothermic chain reaction of $Cl_2$ with $H_2$ is possible, resulting in the formation of HCl [$Cl_2+H_2 \rightarrow 2HCl$] (−92.5 kcal/mol HCl). Silicon precursors that decompose at low temperatures can also produce highly exothermic reactions with $Cl_2$. For example, trisilane can react with $Cl_2$ to form HCl and considerable heat in the following reaction:

$$Si_3H_8+10Cl_2 \rightarrow 3SiCl_4(g)+8HCl \qquad \text{(Equation 1)}.$$

Moreover, with enough $Cl_2$ available at high pressures, the stable molecule $SiCl_4$ can also be formed in the following exothermic reaction:

$$Si(s)+2\,Cl_2 \rightarrow SiCl_4(g) \qquad \text{(Equation 2)}.$$

Another intermediate species that could be formed in an exothermic reaction is $SiCl_2$ as in the following reaction, which itself can lead to additional decomposition in the presence of $H_2$:

$$Si(s)+Cl_2 \rightarrow SiCl_2(g) \qquad \text{(Equation 3)}.$$

Accordingly, the reaction of $Cl_2$ with silicon precursors such as $SiH_4$, $Si_2H_6$, $Si_3H_8$ can become quite exothermic and quickly consume the silicon source gas. The problem of heat formation is particularly significant in the gas panel where the pressure is substantially higher than in the reactor, and especially at the point of mixing where reactions might occur in small volumes. Enough heat produced in the gas lines to decompose a silicon precursor can consequently lead to deposition inside the gas panel.

Thus, there is a need for improved methods for the selective deposition of silicon-containing films particularly at low deposition temperatures that avoid highly exothermic reactions and detrimental heat formation, while maintaining high deposition rates and selectivity.

Embodiments of the invention provide methods for selectively depositing Si-containing materials using a silicon source, an etchant, an inhibitor source and, optionally, source(s) of other elements such as electrical active dopant(s), carbon, germanium, and/or tin are used or added. Under the CVD conditions taught herein, the delivery of the silicon source, etchant and inhibitor source to the surface of a substrate preferably results in the formation of a Si-containing film selectively over single crystal substrates or single crystal regions of mixed substrates. The addition of the inhibitor decelerates or suppresses exothermic reactions with the etchant to maintain high deposition rates and selectivity at low deposition temperatures.

Exothermic reactions can cause considerable heat, and if excessively high can cause a gas mixture to self-ignite. The self-ignition of gases from rapid exothermic reactions has been found to occur immediately after mixing pure dichlorosilane and chlorine at P>1 Torr (DCS: $Cl_2$=1:1). However, it has also been found that additions of propylene ($C_3H_6$) cause an inhibiting effect on the self-ignition of dichlorosilane mixtures with $Cl_2$ at 293 K, as further described below. An induction period or delay for the self-ignition of gases was found to arise at P<1 Torr with the addition of $C_3H_6$, and was measured as high as 6 seconds at the lower self-ignition threshold of 0.55 Torr. Although the present application is not limited to theory, the existence of a threshold and the absence of immediate self-ignition above this threshold under experimental conditions suggest that a chain branching reaction occurs with reactive intermediaries.

A polymerization reaction typically includes chain origination, chain branching or propagation, and chain termination. Chain branching is a process in which a reactive intermediary is continuously regenerated during the course of a chemical reaction. For example, in a polymerization reaction chain branching occurs when the reactive end-groups of a polymer chain react in each propagation step with a new monomer molecule, transferring the reactive group to that unit. Chain termination occurs when any chemical reaction leads to the destruction of a reactive intermediary in a chain propagation step in the course of a polymerization reaction, effectively bringing the reaction to a halt.

Chemiluminescence and absorption spectra have shown that at least two reactive intermediaries formed during self-ignition of the dichlorosilane mixtures include the silylenes SiHCl and $SiCl_2$. (See, e.g., C. P. Conner and E. W. Stewart, J. Am. Chem. Soc., 1977, 99, 2544; F. T. Chau, D. C. Wang, E. P. F. Lee, J. M. Dyke and D. K. W. Mok, J. Phys. Chem., A, 1999, 103, 4925). Although not limited to theory, it accordingly appears that silylene radicals participate in the chain branching reactions of the chlorination of silicon precursors. A number of chain branching reactions with reactive intermediaries such as silylene radicals, including the ones observed, such as SiHCl and $SiCl_2$, can occur in silicon-chlorine reactions, including but not limited to the following:

$$:SiH_2 + Cl_2 \rightarrow :SiHCl + HCl + 363 \text{ kJ mol}^{-1} \quad \text{(Equation 4)};$$

$$:SiH_2 + Cl_2 \rightarrow :SiH_2Cl + Cl + 221 kJ/mol^{-1} \quad \text{(Equation 5)};$$

$$:SiCl_2 + SiH_2Cl_2 \rightarrow Cl_3SiSiH_2Cl \rightarrow :SiH_2 + SiCl_4 \quad \text{(Equation 6)}.$$

The above reactions can cause additional chain branching reactions from the subsequently formed reactive intermediaries, produce additional HCl, or increase the amount of heat emission from highly exothermic reactions, such as from the formation of $SiCl_4$ and other stable molecules.

Enhancing chain termination reactions can decelerate or suppress the above reactions, and delay or prevent self-ignition of the gas mixtures. One rapid chain termination reaction with a silylene radical includes the following reaction:

$$:SiH_2 + H_2 \rightarrow SiH_4 (10^{-13} \text{ cm}^3 s^{-1}) \quad \text{(Equation 7)}.$$

But this termination reaction is limited, since the self-ignition observed for silicon-chlorine mixtures indicates that extensive chain branching and minimal termination occur for silicon-chlorine reactions. However, alkene or olefin molecules, such as propylene ($C_3H_6$), react very rapidly with silylenes, such as $SiH_2$, SiHCl and $SiCl_2$. For example, the rate constants of the reaction between silylenes and $C_3H_6$ vary from about $10^{-10}$ cm$^3$s$^{-1}$ (for $SiH_2$) to about $10^{-11}$ cm$^3$s$^{-1}$ (for SiHCl and $SiCl_2$). Thus, although not limited by theory of operation, the heat emission of exothermic silicon-chlorine reactions can be considerably decreased with the addition of olefin molecules since they react rapidly with silylenes, and consequently accelerate and increase the termination of some of the chain branching caused by silylene radicals as chain carriers. Accordingly, the self-ignition and excessive heat emission for silicon-chlorine reactions can be controllably decreased by adding inhibitor molecules to the silicon-chlorine mixtures for decelerating reactions between a silicon precursor and a chlorine-containing etchant, according to embodiments of the invention.

Other molecules may be added as inhibitors to the deposition feed gas for inhibiting the self-ignition of the gas mixtures by, for example, reacting rapidly with chain carriers and thereby increasing the chain termination of silicon-chlorine reactions. According to another embodiment, butadiene ($C_4H_6$) molecules are added to the feed gas along with a silicon source and a chlorine-containing etchant. Butadiene can stabilize silylene radicals such as $:Si_2H_4$ in the gas phase by bonding to the reactive intermediary by weak bonding forces, such as hydrogen and Van der Waals bonding, or strong bonding forces, such as donor-acceptor, covalent bonding, etc. More generally, inhibitor molecules that can bond to chain carriers such as silylene radicals and that can be added to the feed gas along with a silicon source and a chlorine-containing etchant, include but are not limited to: conjugated systems, such as compounds containing one or more sequences of alternating single and multiple, including double or triple, bonds, such as carbon-carbon or carbon-oxygen bonds. Inhibitor molecules include aromatic hydrocarbons, such as benzene, napthalene, phenanthrene, and anthracene; non-benzenoid aromatic compounds such as cycloheptatriene and aromatic annulenes; and other linear or cyclic aromatic compounds, such as furan, pyridine, pyrrole (nitrogen-containing compounds) and thiophene (sulfur-containing compound).

Conjugated systems include molecular structures that comprise alternating single and multiple bonds, such as $CH_2=CH-CH=CH_2$, $CH_2=CH-C\equiv N$. In such systems, conjugation is the interaction of one p-orbital with another across an intervening σ-bond in such structures, although in other molecular entities, d-orbitals may be involved. Conjugated systems also include the analogous interaction of an element having a p-orbital with an unshared electron pair, e.g. :Cl—CH=CH$_2$. Conjugated systems also include polyenes, which are acyclic hydrocarbons having a molecular structure containing alternating carbon-carbon double and single bonds. A cyclically conjugated molecular entity having stability, due to delocalization, that is greater than that of a hypothetical localized structure, such as a Kekulé structure, is considered as possessing 'aromatic' character. If the structure is of higher energy, e.g., less stable, than such a hypothetical classical structure, the molecular entity is considered 'antiaromatic.' The most widely used method for determining aromaticity is the observation of diatropicity in the $^1$H NMR spectrum. The terms 'aromatic' and 'antiaromatic' have been extended to describe the stabilization or destabilization of transition states of pericyclic reactions.

Although not limited to theory, it is possible that adducts of the above molecules that are bound by weak bonding forces can split when hitting the depositing surface. However, the inhibitor molecules nonetheless enhance the efficiency of deposition even if they only inhibit chain propagation in the gas phase prior to decomposing on the depositing surface. Even if the exothermic reactions with silylene radicals as described herein are not completely suppressed, the addition of inhibitor molecules can cause sufficient deceleration of the excessive heat emission and self-ignition that would occur in the absence of the inhibitors. Moreover, a small temperature increase may not in itself be harmful, and may even be beneficial for achieving high growth rates, particularly in a cold wall, quartz chamber.

Thus, the highly exothermic reaction of, for example, trisilane in the reaction $Si_3H_8+10Cl_2 \rightarrow 3SiCl_4+8Cl$ at low temperatures during the selective deposition of silicon-containing materials can be decelerated according to embodiments of the invention. Other less exothermic but significant reactions with $Si_2H_6$, $SiH_4$, dichlorosilane (DCS), partially chlorinated disilanes and other silicon precursors can likewise be decelerated. In one embodiment, the silicon precursor and etchant source chemicals are at least as reactive, or produce at least as exothermic reactions, as mixtures containing dichlorosilane and chlorine gas ($Cl_2$).

Accordingly, an embodiment provides a method for depositing a single crystalline silicon film, comprising: providing a substrate disposed within a chamber; introducing to the chamber under chemical vapor deposition conditions a silicon precursor, a chlorine-containing etchant and an inhibitor source for decelerating reactions between the silicon precursor and the chlorine-containing etchant; and selectively depositing a doped crystalline Si-containing film onto the substrate. The inhibitor is preferably a carbon-containing molecule, such as propylene, butadiene or benzene. According to an embodiment, the silicon source is disilane, trisilane, tetrasilane, cyclopentasilane, neopentasilane, monochlorodisilane or dichlorodisilane and the chlorine-containing etchant is chlorine gas. According to an embodiment of the invention, the Si-containing film is selectively formed over a single crystal semiconductor surface while minimizing or avoiding deposition over a dielectric surface in a ratio of preferably about>10:1. According to another embodiment, the ratio of selective deposition is about>50:1. According to yet another embodiment, the ratio of selective deposition is about 100% such that no deposition occurs on the dielectric surface at all.

Deposition may be suitably conducted according to the various CVD methods known to those skilled in the art, but an exemplary deposition process is conducted according to the CVD methods taught herein. The disclosed methods may be suitably practiced by employing CVD, including plasma-enhanced chemical vapor deposition ("PECVD") or thermal CVD, utilizing a silicon source, a chlorine-containing etchant and an inhibitor source to selectively deposit a single crystalline Si-containing film onto a substrate within a CVD chamber. In some embodiments, the Si-containing film is a carbon-doped epitaxial Si film. In the following description, reference may be made to the use of a silicon source, a chlorine-containing etchant and an inhibitor source to deposit a Si or Si-containing film. It will be recognized that those descriptions are also generally applicable to the deposition of other Si-containing films, e.g., the deposition of SiGe:C, Si:Sn, SiGe:Sn, Ge:Sn, SiSn:C, SiGe:Sn:C or Ge:Sn:C films or films involving the use of a germanium source and/or a tin source to the deposition of electrically doped Si:C, SiGe:C, Si:Sn, SiGe:Sn, Ge:Sn, SiSn:C, SiGe:Sn:C or Ge:Sn:C films or films involving the use of a dopant precursor for an electrical dopant, unless otherwise stated. Thermal CVD is preferred, as deposition can be achieved effectively without the risk of damage to substrates and equipment that can occur with plasma processing.

In an embodiment, a silicon source, a chlorine-containing etchant, an inhibitor source, and optionally an electrical dopant precursor, are introduced to the chamber in the form of separate gases or by intermixing to form a feed gas. The intermixing to form the feed gas may take place within the chamber or upstream of the chamber prior to introduction of the feed gas to the chamber. According to preferred embodiments of the invention, the silicon source, chlorine-containing etchant and inhibitor source are introduced to the chamber in separate gases in order to minimize the harmful effects of self-ignition of the gas mixtures, such as preventing those that could occur at the gas panel. Intermixing to form a feed gas can take place in the chamber upstream of the substrate.

According to one embodiment, the total pressure in the CVD chamber is in the range of about 0.001 Torr to about 1000 Torr. According to another embodiment, the total pressure in the CVD chamber is in the range of about 0.1 Torr to about 350 Torr. According to another embodiment, the total pressure in the CVD chamber is in the range of about 0.25 Torr to about 200 Torr. This latter range of 0.25 Torr to 200 Torr is sometimes referred to as "reduced pressure" CVD ("RPCVD") as distinct from even lower pressure ranges for "low pressure" CVD ("LPCVD"), which are conducted in the milliTorr range. RPCVD and atmospheric CVD carry even higher risk of damaging exothermic and potentially explosive reactions. The chamber pressure may be referred to herein as a deposition pressure. The feed gas can also include a gas or gases other than the silicon, chlorine-containing etchant and inhibitor source, such as other silicon sources, germanium sources, tin sources, etchant sources, dopant precursor(s) and/or inert carrier gases. The term "dopant precursor(s)" is used herein to refer in a general way to various materials that are precursors to various elements, such as boron, gallium, indium, arsenic, phosphorous, and/or antimony, which may be incorporated into the resulting deposited film in relatively minor amounts. It will be recognized that silicon sources may also be considered dopant precursors for the deposition of SiGe, Si:Sn or SiGe:Sn films that contain relatively minor amounts of silicon. The silicon source, if liquid under storage conditions, can be introduced to the chamber by way of a vaporizer such as a bubbler used with a carrier gas to entrain the silicon source vapor. A gas concentration sensor can measure the amount of the silicon source in the carrier gas flowing from the bubbler. Such sensors are commercially available, e.g., Piezocon® gas concentration sensors from Lorex Industries, Poughkeepsie, N.Y., USA.

Examples of suitable carrier gases for the methods described herein include He, Ar, $H_2$, and $N_2$. It should be understood by one skilled in the art that other suitable carrier gases may be used. However, preferably the main carrier gas, representing the largest source of gas in the system, is a non-hydrogen carrier such as He, Ar and/or $N_2$. Hydrogen gas ($H_2$) is most commonly used as a carrier gas in vapor deposition for semiconductor processing, and particularly in epitaxial deposition. There are several reasons for the popularity of $H_2$ $H_2$ can be provided with a high degree of purity, and the thermal properties of hydrogen are such that it does not have as great a thermal effect on the wafer. Additionally, hydrogen has a tendency to act as a reducing agent, such that it combats the formation of native oxide that results from less than perfect sealing of the reaction chamber. However, in embodiments where $Cl_2$ is an etchant, when free $H_2$ is present as a carrier gas, or in large quantities, the exothermic reaction $Cl_2(g) + H_2(g) \rightarrow 2HCl(g)$ will take place. As discussed above, this reaction in large quantities can lead to very high emission of heat as exemplified by the chain branching reactions with silylene radicals of Equations 4-6, and generate considerable HCl, thereby reducing selective deposition. Accordingly, the use of a non-hydrogen carrier gas (which is generally the dominant gas in the system) can avoid the consumption of $Cl_2$.

Moreover, particular advantages have been found from employing a non-hydrogen carrier gas in gas mixtures for selective deposition of silicon, particular in the combination of trisilane/chlorine deposition with a substitutional dopant precursor. Preferably helium (He), argon (Ar), neon (Ne), xenon (Xe) or nitrogen gas ($N_2$), or a combination of such inert gases, is employed in place of hydrogen. According to an embodiment, He is employed, as it has thermal behavior close to that of $H_2$ and thus entails less tuning of the reactor for the adjustment from use of $H_2$ carrier gas.

The silicon precursor and supplemental silicon sources may include: silane, disilane, trisilane, tetrasilane, cyclopentasilane, neopentasilane, monochlorosilane, dichlorosilane, monochlorodisilane as silicon sources. The feed gas may also contain other materials known by those skilled in the art to be useful for doping or alloying Si-containing films, as desired, such as a supplemental silicon source, germanium source, tin source, boron source, gallium source, indium source, arsenic source, phosphorous source, and/or antimony source. Specific examples of other such sources include: germane and digermane as germanium sources; monosilylmethane, disilylmethane, trisilylmethane, tetrasilylmethane, monomethyl silane (MMS), and dimethyl silane as both silicon and a supplemental source of carbon; and various dopant precursors as sources of electrical dopants (both n-type and p-type) such as antimony, arsenic, boron, gallium, indium and phosphorous. Chlorosilylmethanes of the general formula ($SiH_{3-z}Cl_z$)$\times CH_{4-x-y}Cl_y$, where x is an integer in the range of 1 to 4 and where y and z are each independently zero or an integer in the range of 1 to 3, with the provisos that $x+y \leq 4$ and at least one of y and z is not zero, have been found to be particularly useful as sources of carbon, silicon and chlorine.

A suitable manifold may be used to supply feed gas(es) to the CVD chamber. The CVD chamber is preferably in a single wafer reactor, e.g., a single wafer, horizontal gas flow CVD chamber. Most preferably, the CVD chamber is in a single-wafer, single pass, laminar horizontal gas flow reactor, preferably radiantly heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products in situ, or downstream of a remote plasma generator, to the chamber, but as noted above, thermal CVD is preferred.

Thermal CVD is preferably conducted at a substrate temperature that is effective to deposit a crystalline Si-containing film over the substrate. Preferably, thermal CVD is conducted at a temperature less than about 750° C. According to another embodiment, thermal CVD is conducted at a temperature less than about 650° C. According to another embodiment, thermal CVD is conducted at a temperature in a range of about 500-600° C. For selective deposition of intrinsic silicon with high levels of substitutional dopants, thermal CVD is most preferably conducted at a temperature in the range of 500-600° C. PECVD is preferably conducted at a temperature in the range of about 300° C. to about 700° C. Those skilled in the art can adjust these temperature ranges to take into account the realities of actual manufacturing, e.g., preservation of thermal budget, deposition rate, different sizes of chambers, including single wafer and batch reactors, preferred total pressures and partial pressures, etc. In general, higher partial pressures entail lower temperatures for a given desired result, whether it be deposition rate, layer quality or a combination of the two. The substrate can be heated by a variety of methods known in the art, e.g., resistive heating and lamp heating.

Doped Silicon-Containing Films

According to embodiments of the invention, an inhibitor source for decelerating exothermic reactions between a silicon precursor and chlorine-containing etchant contains carbon-containing molecules including but not limited to, for example, propylene, butadiene, benzene, napthalene, phenanthrene, anthracene, cycloheptatriene cation, cycloheptatriene, furan, pyridine, pyrrole and thiophene. According to embodiments, the carbon-containing inhibitor source is the source for carbon incorporation in the Si-containing film. Thus, the single crystalline Si-containing films may be substitutionally doped with carbon, e.g., where the dopants replace Si in the lattice structure. According to an embodiment, the inhibitor source is the only source for substitutional carbon in the Si-containing film. According to another embodiment, supplemental carbon sources may be used in addition to the inhibitor source to provide for substitutional doping of carbon. As is known in the art, the lattice constant for single crystal silicon is about 5.431 Å, whereas single crystal carbon in the form of diamond has a lattice constant of 3.567 Å due to the small size of the carbon atoms. Accordingly, tensile strain may be introduced into single crystalline silicon by substitutional doping with carbon, because carbon atoms are smaller than the silicon atoms that they replace.

In some embodiments, the thickness of a single crystalline silicon film comprising a strain-modifying amount of substitutional carbon as described herein is preferably less than a critical film thickness. Those skilled in the art understand that a critical film thickness is a film thickness at which a strained film relaxes under a particular set of conditions. As the concentration of substitutional dopant (e.g. carbon) increases, the critical thickness generally decreases. Films having a thickness less than the critical thickness typically remain strained under those conditions. For example, a single crystalline silicon film comprising about 1.8 atomic % substitutional carbon may have a critical thickness of about 200 mn at 550° C., whereas an otherwise similar film comprising 3.5 atomic % substitutional carbon may have a critical thickness of about 15-20 mn at the same temperature. Films having a thickness that is less than a critical thickness for that film will tend to remain strained unless or until sufficiently perturbed, or exposed to sufficient heat to cause relaxation. In an embodiment, a Si:C, SiGe, SiGe:C, Si:Sn or Ge:Sn film is configured to exert a strain on an adjacent layer. For example, a tensile strain may be exerted on a Ge film that is deposited onto a relaxed Ge:Sn layer. In another example, a compressive strain may be exerted on a Ge:Sn film that is deposited onto a relaxed Ge layer. In an embodiment, a strained Si:C film that is selectively formed in a recessed source/drain region exerts a tensile strain on a silicon channel formed between the source and drain, as described in greater detail below. Such configurations may be used in various applications, e.g., to improve electron mobility for NMOS devices. In another embodiment, a strained SiGe film that is selectively formed in a recessed source/drain region exerts a tensile strain on a germanium channel formed between the source and drain. Such configurations may also be used to improve electron mobility for NMOS devices. In another embodiment, a strained Ge:Sn film that is selectively formed in a recessed source/drain region exerts a compressive strain on a germanium channel formed between the source and drain. Such configurations may be used in various applications, e.g., to improve hole mobility for PMOS devices.

The single crystalline Si-containing films may further comprise an electrically active dopant, e.g., a dopant selected from the group consisting of phosphorous and arsenic for NMOS applications. Incorporation of electrically active dopants into Si-containing films by CVD is preferably accomplished by in-situ doping using dopant sources or dopant precursors. Preferred precursors for electrical dopants are dopant hydrides, including p-type dopant precursors such as diborane, deuterated diborane, and n-type dopant precursors such as phosphine, arsenic vapor, and arsine. Silylphosphines, e.g., $(H_3Si)_{3-x}PR_x$, and silylarsines, e.g., $(H_3Si)_{3-x}AsR_x$, where $x=0-2$ and $R_x=H$ and/or deuterium (D), are alternative precursors for phosphorous and arsenic dopants. $SbH_3$ and trimethylindium are alternative sources of antimony and indium, respectively. Such dopant precursors are useful for the preparation of preferred films as described below, preferably boron-, phosphorous-, antimony-, indium-, and arsenic-doped silicon, Si:C, SiGe, SiGeC, SiGe:Sn:C, SiGe:Sn, Si:Sn:C, SiSn and Ge:Sn films and alloys. The amount of dopant precursor in the feed gas may be adjusted to provide the desired level of dopant in the Si-containing film. Preferred concentrations of dopant precursor in the feed gas are in the range of about 1 part per billion "ppb" to about 20% by weight based on the total weight of reactive gas, excluding inert carrier and diluent gases.

For the inhibitor source such as olefin, butadiene, etc., concentrations in the feed gas can be in the range of about 1 standard cubic centimeters per minute "sccm" up to about 100 sccm, although higher or lower amounts are sometimes preferred in order to achieve the desired property in the resulting film. For electrical dopants, preferred concentrations of dopant precursor, such as pure phosphine or equivalent diluted phosphine, arsine or diborane, in the feed gas can be between about 0.1 sccm to about 5 sccm, although higher or lower amounts are sometimes preferred in order to achieve the desired property in the resulting film. In the preferred Epsilon™ series of single wafer reactors, dilute mixtures of the dopant precursor in a carrier gas can be delivered to the reactor via a mass flow controller with set points ranging from about 3 sccm to about 1000 sccm, depending on desired dopant concentration and dopant gas concentration. Dilution of dopant gases can lead to factors of $10^{-7}$ to $10^{-2}$ to arrive at equivalent pure dopant flow rates. Typically commercially available dopant sources are dopant hydrides diluted in $H_2$, e.g., 1% arsine or 1% phosphine in $H_2$. However, as described above with respect to preferred non-hydrogen carrier gases, in some embodiments dopant precursors are diluted in a non-hydrogen inert gas. The dilute mixture is preferably further diluted by mixing with the silicon source, chlorine-containing etchant, a suitable carrier gas, and the inhibitor source which also acts as a strain-influencing sour for substitutional doping. Since typical total flow rates for deposition in the preferred Epsilon™ series reactors often range from about 5 standard liters per minute ("slm") to about 50 slm, the concentration of the dopant precursor used in such a method is generally small relative to total flow.

The relative amounts of the various feed gas components may be varied over a broad range depending on the composition desired for the resulting Si-containing film and the deposition conditions employed, such as temperature, pressure, deposition rate, etc., and may be determined by routine experimentation in view of the guidance provided herein. The feed gas components may be intermixed and then delivered to the chamber or substrate. However, according to preferred embodiments of the invention, the feed gas is formed by mixing the components in the chamber upstream of the substrate, e.g., by supplying the feed gas components to the CVD chamber separately.

Process Integration

In the embodiments of FIGS. 1-6, the Si-containing layer is selectively formed in recessed source/drain ("S/D") regions 20, and is preferably deposited under conditions that maintain stress, such that the layer is kept below the critical thickness for the process temperature and pressure. The smaller lattice constant of the Si-containing material filling the S/D recesses exerts tensile strain on the channel region 22 therebetween. Preferably a dopant hydride is added to the process flow, in addition to the silicon source, a chlorine-containing etchant and an inhibitor source, such as a carbon-containing molecule as described herein. Preferably an electrical dopant such as phosphine or arsine, is employed. The process described below for the selective deposition of Si:C in the recessed source/drain regions 20 may be adapted by those skilled in the art to selectively deposit a variety of Si-containing materials using routine experimentation in view of the guidance provided herein.

FIG. 1 is a schematic cross-sectional view showing a substrate 10 comprising a silicon wafer in the illustrated embodiment. The substrate 10 can include an epitaxial layer formed over a wafer or an SOI substrate. Field isolation regions 12 have been formed by conventional shallow trench isolation ("STI") techniques, defining active areas 14 in windows among the STI elements. Alternatively, any suitable method can be used to define field insulating material, including local oxidation of silicon ("LOCOS") and a number of variations on LOCOS or STI. It will be understood that several active areas are typically defined simultaneously by STI across the substrate 10, and that the STI often forms a web separating transistor active areas 14 from one another. The substrate is typically background doped at a level suitable for channel formation.

Figure 2:
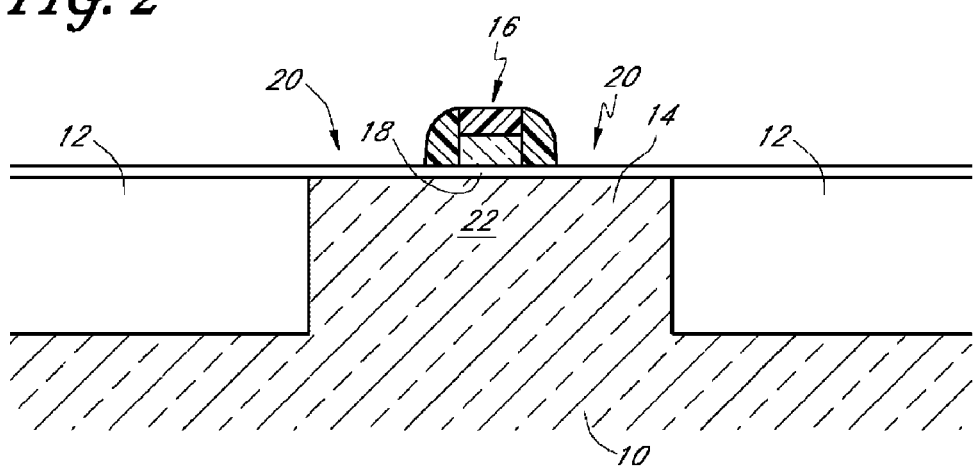
FIG. 2 shows the structure of FIG. 1 after formation of a transistor gate electrode within an active area window.

FIG. 2 illustrates the substrate 10 after formation of a gate electrode 16 over the active area 14. While illustrated as a traditional silicon electrode, surrounded by insulating spacers and cap layers, and separated from the underlying substrate 10 by a gate dielectric layer 18, it will be understood that the transistor gate stack can have any of a variety of configurations. In some process flows, for example, the spacers can be omitted. In the illustrated embodiment, the gate electrode 16 defines source and drain regions 20 on either side of the transistor gate electrode 16 within the active area 14. The gate electrode 16 also defines a channel region 22 under the gate electrode 16 and between the source and drain regions 20.

Figure 3:
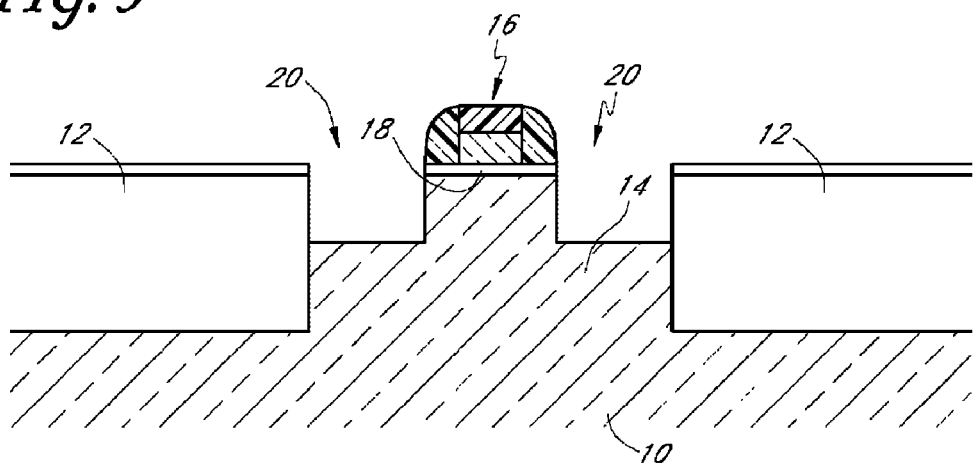
FIG. 3 shows the structure of FIG. 2 after recessing source and drain regions on either side of the gate electrode.

FIG. 3 illustrates the result of an etch step that selectively removes exposed silicon. Preferably a reactive ion etch ("RIE") can be employed to produce vertical sidewall definition and minimal damage to exposed oxide and nitride materials, but the skilled artisan will appreciate that other recess profiles and other etch techniques can be employed. Preferably the depth of the recesses is less than the critical thickness of the layer to be deposited in the recess although strain on the channel can also be obtained by deposition greater than the critical thickness. As the exposed silicon is essentially the source and drain (S/D) regions 20 of the active area 14, the etch is referred to as a source/drain recess. It will be understood that, in some arrangements, a first step of clearing the thin dielectric over the source/drain regions may be employed.

FIG. 4 shows the result of refilling the recessed S/D regions 20 with a selective deposition process. In particular, the exposed semiconductor surfaces are cleaned, such as with an HF vapor or HF last dip, leaving a pristine surface for epitaxy thereover. A silicon source and etchant source such as chlorine gas are introduced as described above, along with a carbon-containing inhibitor utilized additionally as a substitutional dopant. For the illustrated embodiment of FIGS. 1-6, the substitutional dopant is a carbon that produces a substitutionally doped film that creates strain on the channel region, as described in more detail below. The substitutional carbon in this example may be from the carbon-containing inhibitor source or from supplemental carbon sources. Preferably dopant hydrides are included in the process vapor mixture. A silicon-containing epitaxial layer grows selectively in the S/D regions 20. Advantageously, a selectively deposited, heteroepitaxial film 30 fills the S/D regions 20 and exerts strain on the channel region 22. In the illustrated embodiment, the heteroepitaxial film 30 is approximately flush with the surface of the channel region 22. As illustrated, the selective deposition minimizes or avoids deposition over the amorphous regions, e.g., over the insulators including field isolation regions 12 which is generally a form of silicon oxide, and the sidewall spacers and cap layer, typically silicon nitride, on the gate electrode 16.

FIG. 5 illustrates an optional extension of the selective deposition to form elevated S/D regions 20 with the extended heteroepitaxial film 32. As the portion of the extended film 32 below the surface of the channel region 22 exerts lateral stress on the channel region 22, the portion above the surface of the substrate need not include as much or any lattice deviation from the natural silicon lattice constant. Accordingly, any supplemental carbon sources can be tapered or halted for the portion of the selective deposition above the surface of the channel region 22, and the silicon source and chlorine flows continued. The inhibitor sources and electrical dopant source gases, particularly dopant hydrides such as arsine or phosphine, are preferably continued.

The elevated S/D structure 32 of FIG. 5 provides additional silicon material above the surface of the substrate 10. As is known in the art, through subsequent processing, insulating layers are deposited and contacts are made through the insulating film to the source and drain regions 20. The additional silicon material facilitates formation of silicide contacts, which reduce contact resistance and form ohmic contacts. Accordingly, nickel, cobalt or other metal is deposited into the contact hole and allowed to consume the excess silicon without disturbing electrical properties of shallow junctions for the underlying source/drain regions.

FIG. 6 shows another embodiment, in which the structure of FIG. 2 is subjected to the selective deposition using a silicon source, a carbon-containing inhibitor source and chlorine gas, without the intervening S/D recess step. In this case, the selective deposition serves only to raise the source and drain regions, providing excess silicon 34 to permit consumption by contact silicidation without destroying shallow junctions. The deposition can optionally include electrical dopant precursors to deposit the Si-containing layer doped with an electrically active dopant. Such electrical dopants are unnecessary, however, if the entire excess silicon structure 34 is to be consumed by contact silicidation.

The selective nature of the silicon source/chlorine/inhibitor process obviates subsequent pattern and etch steps to remove excess deposition from over field regions. Even imperfect selectivity can permit use of a timed wet etch to remove unwanted deposition over insulating surfaces, rather than requiring an expensive mask step. Furthermore, superior film quality is obtained at relatively high deposition rates, improving throughput. For example, certain process embodiments may be used to selectively deposit boron-doped SiGeC using a silicon source, methylsilane, $B_2H_6$, chlorine and inhibitor source to form, e.g., a base structure of a heterobipolar transistor ("HBT").

Figure 7:
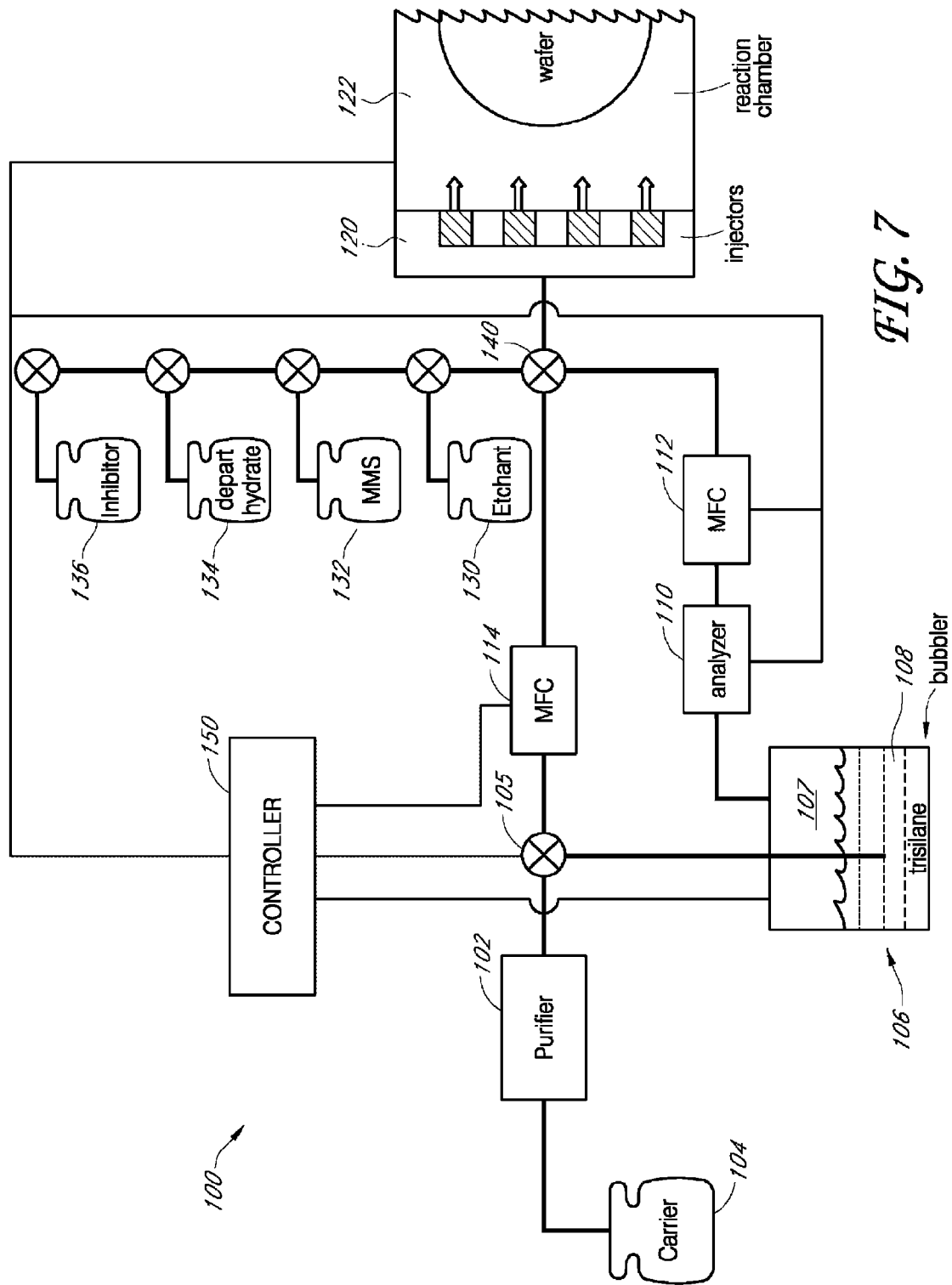
FIG. 7 is a schematic view of a reactor set up for a system employing trisilane, a chlorine-containing etchant gas, an inhibitor source and a carrier gas for selectively depositing silicon-containing films in accordance with a preferred embodiment.

FIG. 7 illustrates a reactor system 100 employing a carrier gas, illustrated as helium, an inhibitor source, such as $C_3H_6$, a silicon source, trisilane in the illustrated embodiment, a chlorine-containing etchant, $Cl_2$ in the illustrated embodiment, and a supplemental carbon source, MMS in the illustrated embodiment. As shown, a purifier 102 is positioned downstream of the carrier gas source 104. Some of the inert gas flow is shunted at valve 105 to a vaporizer in the form of a bubbler 106, from which the carrier gas carries vaporized trisilane 108. Alternatively, the trisilane can be simply heated to increase the vapor pressure of trisilane in the space 107 above the liquid, and the carrier gas picks up trisilane as it passes through that space 107. In any case, downstream of the liquid reactant source container 106 is an analyzer 110 that determines, by measuring the speed of sound through the vapor, the reactant concentration of the flowing gas. Based upon that measurement, the setpoint for the software-controlled downstream mass flow controller (MFC) 112 is altered by the analyzer 110. Such analyzers are commercially available.

The flow through this MFC 112 merges with the main carrier gas through the main carrier gas MFC 114 and other reactants at valve 140, upstream of the injection manifold 120 for the deposition chamber 122. The flow through MFC 112, MFC 114 or valves for other reactants is determined at a gas panel (not shown), which is typically a panel that includes valves to all the sources and all the MFC's shown in FIG. 7. A source of etchant gas 130 is also provided for selective deposition processes, preferably $Cl_2$ gas. In the illustrated embodiment, an inhibitor source 136 and a source for dopant hydride 134 are also provided.

As illustrated, the reactor system 100 also includes a central controller 150, electrically connected to the various controllable components of the system 100. The controller is programmed to regulate gas flows, temperatures, pressures, etc., to practice the deposition processes as described herein upon a substrate housed within the reaction chamber 122. As will be appreciated by the skilled artisan, the controller 150 typically includes a memory and a microprocessor, and may be programmed by software, hardwired or a combination of the two, and the functionality of the controller may be distributed among processors located in different physical locations. Accordingly, the controller 150 can also represent a plurality of controllers distributed through the system 100.

In the illustrated embodiment, with the carbon-containing inhibitor source 132 in combination with trisilane and chlorine, selective deposition of a Si-containing layer at low deposition temperatures can be achieved, as disclosed hereinabove. In another embodiment, the dopant hydride source 134 is preferably also provided to produce in situ doped semiconductor layers with enhanced conductivity. According to an embodiment, a boron source such as diborane ($B_2H_6$) is provided as the dopant hydride source 134 along with a germane source and/or tin source (not illustrated) for SiGe, SiGeSn or GeSn epitaxy, and the layer is electrically doped. Preferably, for Si:C epitaxy with carbon-containing inhibitor 136 and optionally with supplemental carbon source MMS 132, the dopant hydride is arsine or phosphine, and the layer is n-type doped. More preferably, the diluent inert gas for the dopant hydride is a non-hydrogen inert gas as noted above. Thus, the MMS, phosphine and the inhibitor are preferably stored at their source containers 132, 134 and 136 in, e.g., helium. Typical dopant hydride concentrations are 0.1% to 5% in helium, more typically 0.5% to 1.0% in helium for arsine and phosphine. Typical inhibitor source concentrations are 5% to 50% in helium, more preferably 10% to 30% in helium.

Selective deposition of Si-containing films with inhibitor molecules along with a silicon source and chlorine-containing etchant as described herein offer significant advantages over the use of conventional precursors when conducted as described herein. In particular, high growth rates (at least about 5 nm/min, preferably at least about 10 nm/min) and high etch capabilities of a silicon etchant as desired for the selective deposition of Si-containing films are enabled at low deposition temperatures, e.g., at a deposition temperature below about 750° C. In other words, high deposition rates can be achieved while still maintaining selectivity. Moreover, the process is highly tunable by adjusting the amount of inhibitor molecules that are added to the feed gas.

The embodiments illustrated and described above are provided only as examples of certain preferred embodiments. Various changes and modifications can be made to the embodiments presented herein by those skilled in the art without departure from the spirit and scope of the disclosure, which is limited only by the appended claims.

What is claimed is:

1. A method for depositing a single crystalline silicon film, comprising:
    providing a substrate disposed within a chamber;
    introducing to the chamber under chemical vapor deposition conditions a silicon precursor, a chlorine-containing etchant and an inhibitor source that reacts to decelerate reactions between the silicon precursor and the chlorine-containing etchant; and
    selectively depositing a crystalline Si-containing film onto the substrate.

2. The method of claim 1 wherein the chlorine-containing etchant comprises chlorine gas.

3. The method of claim 2, wherein the silicon precursor comprises dichlorosilane.

4. The method of claim 3, wherein the inhibitor source comprises propylene ($C_3H_6$).

5. The method of claim 3, wherein the inhibitor source comprises butadiene ($C_4H_6$).

6. The method of claim 3, wherein the inhibitor source comprises an aromatic hydrocarbon.

7. The method of claim 3, wherein the inhibitor source comprises benzene.

8. The method of claim 3, wherein the inhibitor source comprises a non-benzenoid aromatic hydrocarbon.

9. The method of claim 2, wherein the silicon precursor is selected from the group consisting of disilane, trisilane, tetrasilane, neopentasilane, monochlorosilane, dichlorodisilane, trichlorodisilane, monochlorodisilane, or a combination thereof.

10. The method of claim 1, further comprising intermixing a non-hydrogen inert carrier gas with the silicon precursor, the chlorine-containing etchant and the inhibitor source.

11. The method of claim 10, wherein the non-hydrogen inert carrier gas is selected from the group consisting of helium, argon, neon, xenon, nitrogen gas, and a combination thereof.

12. The method of claim 1, further comprising introducing a dopant precursor to the chamber during selectively depositing.

13. The method of claim 1, wherein the silicon film comprises substitutional carbon as deposited.

14. The method of claim 13, wherein the chemical vapor deposition conditions comprise a deposition temperature below about 750° C.

15. The method of claim 1, wherein the chemical vapor deposition conditions comprise a deposition rate of at least about 5 nm per minute.

16. The method of claim 1, wherein the silicon precursor, chlorine-containing etchant and inhibitor source are introduced to the chamber separately.

17. The method of claim 1, wherein introducing the inhibitor source comprises introducing about 1 sccm to about 100 sccm of the inhibitor source.

18. A method of depositing a crystalline Si-containing film, comprising:
    providing a substrate disposed within a chamber;
    introducing a silicon precursor and a chlorine gas ($Cl_2$) to the chamber;
    decelerating reactions between the silicon precursor and the chlorine gas by introducing a carbon-containing inhibitor source to the chamber; and
    selectively depositing the single crystalline Si-containing film onto the substrate.

19. The method of claim 18, wherein the silicon precursor, chlorine gas and inhibitor source are introduced to the chamber separately.

20. The method of claim 18, further comprising intermixing a non-hydrogen inert carrier gas with the silicon precursor, the chlorine gas and the inhibitor source.

21. The method of claim 18, wherein the inhibitor source is selected from the group consisting of propylene, butadiene, benzene, napthalene, phenanthrene, anthracene, cycloheptatriene cation, cycloheptatriene, furan, pyridine, pyrrole and thiophene.

22. The method of claim 18, wherein the Si-containing film comprises substitutional carbon as deposited.

23. The method of claim 18, wherein the silicon precursor and the chlorine gas are at least as reactive as mixtures containing dichlorosilane and chlorine gas.

24. The method of claim 18, wherein selectively depositing the Si-containing film occurs at a deposition temperature in the range of below about 650° C.

25. The method of claim 18, wherein the chemical vapor deposition conditions comprise a deposition rate of at least about 10 nm per minute.

* * * * *

UNITED STATES PATENT AND TRADEMARK OFFICE
CERTIFICATE OF CORRECTION

PATENT NO.       : 7,939,447 B2
APPLICATION NO.  : 11/925518
DATED            : May 10, 2011
INVENTOR(S)      : Bauer et al.

It is certified that error appears in the above-identified patent and that said Letters Patent is hereby corrected as shown below:

In column 2, line 53, please change "germanium" to -- germanium, --

In column 9, line 10, please change "$H_2H_2$" to -- $H_2$. $H_2$. --

In column 10, line 66, please change "mn" to -- nm --

In column 11, line 2, please change "mn" to -- nm --

Signed and Sealed this
Thirteenth Day of November, 2012

David J. Kappos
*Director of the United States Patent and Trademark Office*